United States Patent
Phillips et al.

(10) Patent No.: US 7,591,561 B2
(45) Date of Patent: Sep. 22, 2009

(54) LIQUID COOLED MIRROR FOR USE IN EXTREME ULTRAVIOLET LITHOGRAPHY

(75) Inventors: Alton H. Phillips, East Palo Alto, CA (US); Derek Coon, Redwood City, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 184 days.

(21) Appl. No.: 11/382,342

(22) Filed: May 9, 2006

(65) Prior Publication Data

US 2007/0091485 A1 Apr. 26, 2007

Related U.S. Application Data

(60) Provisional application No. 60/726,321, filed on Oct. 13, 2005.

(51) Int. Cl.
*G02B 5/08* (2006.01)
(52) U.S. Cl. ...................................... 359/845
(58) Field of Classification Search ................. 359/845, 359/838; 355/30, 53
See application file for complete search history.

(56) References Cited

U.S. PATENT DOCUMENTS 4,844,603 A * 7/1989 Eitel et al. .................. 359/845

6,822,251 B1 11/2004 Arenberg et al.
7,292,307 B2 * 11/2007 Kino ........................... 355/30
2005/0099611 A1 5/2005 Sogard

OTHER PUBLICATIONS

Howells, "Some Fundamentals of Cooled Mirrors for Synchrotron Radiation Beam Lines", Optical Engineering 35 (4), pp. 1187-1197, Apr. 1996.
Kohl, "An Experimental Investigation of Microchannel Flow withInternal Pressure Measurements", International Journal of Heat and Mass Transfer, 48 (2005), pp. 1518-1533, 2004.
Anthony, "High Heat Load Optics: An Historical Overview", Optical Engineering, Feb. 1995, vol. 34 No. 2, pp. 313-320.

* cited by examiner

*Primary Examiner*—Euncha P Cherry
(74) *Attorney, Agent, or Firm*—Technology & Innovation Law Group, PC

(57) ABSTRACT

Methods and apparatus for internally or directly cooling a mirror using a fluid with laminar flow properties are disclosed. According to one aspect of the present invention, an internally cooled mirror includes an optical surface that absorbs light, and at least one microchannel formed beneath the optical surface. The mirror also includes a port that supplied a fluid to the microchannel. The fluid is subjected to a laminar flow and absorbs heat associated with the absorbed light.

19 Claims, 16 Drawing Sheets

LIQUID COOLED MIRROR FOR USE IN EXTREME ULTRAVIOLET LITHOGRAPHY

CROSS REFERENCE TO RELATED APPLICATION

The present application claims priority of U.S. Provisional Patent Application No. 60/726,321, filed Oct. 13, 2005, which is incorporated herein by reference in its entirety.

BACKGROUND OF THE INVENTION

1. Field of Invention

The present invention relates generally to equipment used in semiconductor processing. More particularly, the present invention relates to an internally cooled mirror that is suitable for use in an extreme ultraviolet lithography system.

2. Description of the Related Art

Extreme ultraviolet (EUV) lithography is a semiconductor fabrication technology which enables semiconductors with small features, e.g., features with dimensions of approximately 45 nanometers (nm) or less, to be produced. In EUV lithography, a laser heats xenon gas to create a plasma, although there are other method used to make EUV plasmas. Electrons come off the plasma and radiate light. FIG. 1 is a block diagram representation of a EUV lithography system. A EUV lithography system includes a source 104 which provides electrons that radiate light. Source 104 includes a plasma source 108 and a collector mirror 112 that reflects electrons which come off of the plasma generated by plasma source 108 into an illuminator unit 116. Illuminator unit 116 is a condenser that effectively collects light and directs or otherwise focuses the light onto a reticle 120. That is, illuminator unit 116 conditions light from plasma source 108 to improve uniformity. The light reflects off of reticle 120, through projection optics 124, and onto a surface of a wafer 128.

Mirrors included in a EUV lithography system generally absorb some of light or radiation that comes into contact with the mirrors. Such mirrors may be included in illuminator unit 116 as well as in projection optics 124. Often, if the mirrors are multi-coated, the mirrors reflect approximately seventy percent of the incident light on the mirrors while absorbing approximately thirty percent of the incident light. When light is absorbed by a mirror, the absorbed light is converted to heat. Heat generally causes distortion in the mirror, thereby degrading the optical performance of the mirror. When there is distortion in the mirror, the optical performance of the mirror is compromised.

Although radiant cooling methods may be effective in cooling mirrors while causing an insignificant amount of distortion, when the heat load on a mirror is relatively high, radiant cooling methods are often inadequate for cooling mirrors. Internal or direct cooling methods, e.g., liquid cooling methods, may be applied to mirrors to provide cooling in the presence of relatively high heat loads. Conventional internal cooling methods are typically associated with turbulent flow, as turbulent flow provides for relatively efficient heat transfer and cooling. However, the use of turbulent or non-laminar flow to cool a mirror generally causes the mirror to vibrate. When a mirror that is cooled by internal cooling methods which utilize turbulent flow is a part of a EUV lithography system, the vibrations caused by the turbulent flow may adversely affect a lithography process, particularly if the vibrations cause an illuminator unit, projection optics, a reticle, or a wafer to vibrate. By way of example, if a projection optics system or a reticle is subjected to vibrations, a pattern reflected off of the reticle through the projection optics may be inaccurately projected onto the surface of a wafer. As a result, the accuracy of the EUV lithography process may be compromised.

Additionally, if a temperature rise in a mirror is relatively large, heat may be radiated to nearby structures in a EUV lithography apparatus. The radiating of heat to structures in a EUV lithography apparatus may cause adverse structural changes and, as a result, adversely affect the performance of the structures.

Therefore, what is needed is a method and an apparatus which allows a mirror in a EUV lithography system to be efficiently cooled. That is, what is desired is an internal cooling method for a mirror that is a part of a EUV lithography apparatus that allows the mirror to be cooled in the presence of relatively high heat loads, while reducing distortion of the mirror and vibrations within the EUV lithography apparatus.

BRIEF SUMMARY OF THE INVENTION

The present invention relates to a mirror that is suitable for use in an extreme ultraviolet (EUV) lithography system and may be internally cooled using a fluid with laminar flow properties. According to one aspect of the present invention, an internally cooled mirror includes an optical surface that absorbs light, and at least one microchannel formed beneath the optical surface. The mirror also includes a port that supplied a fluid to the microchannel. The fluid is subjected to a laminar flow and absorbs heat associated with the absorbed light.

In one embodiment, the microchannel is part of an azimuthal array of radial microchannels having a pressure drop within the microchannel, when the fluid is contained within the microchannel is less than approximately twenty kiloPascal (kPa).

When a liquid-cooled mirror that may be used in a EUV lithography system uses a liquid with laminar flow properties, vibratory motion in the mirror is generally not caused by the liquid. Hence, the performance of the EUV lithography system is not subjected to vibrations that are caused by systems used to cool the mirror, e.g., a collimator mirror. Further, heat may be removed from the mirror using the liquid or fluid, while achieving acceptable levels of curvature distortion and undulation error.

According to another aspect of the present invention, a directly cooled mirror includes an optical surface, at least one flow path segment arranged beneath the optical surface, a fluid having a Reynold's number that is in a laminar flow range, a feed channel, and an exit channel. The feed channel provides the fluid to the flow path segment, and the fluid absorbs heat associated with the optical surface. The exit channel removes the fluid from the flow path segment after the fluid absorbs the heat associated with the optical surface. In one embodiment, the flow path segment is defined either by a plurality of pins or by a plurality of vanes.

In accordance with yet another aspect of the present invention, a method for internally or directly cooling a mirror with an optical surface arranged to absorb radiation and a plurality of channels beneath the optical surface involves providing the radiation to the optical surface. A fluid is provided to the plurality of channels via at least one feed channel. The fluid has laminar flow properties, and absorbs heat associated with the radiation. Finally, the method includes removing the fluid from the plurality of channels after the fluid absorbs the heat via an exit channel.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE INVENTION

For instances in which the heat load on a mirror is relatively high, radiant cooling methods are often inadequate for cooling mirrors that are a part of an extreme ultraviolet (EUV) lithography system. Internal or direct cooling methods involving the turbulent flow of fluid may be applied to mirrors to provide cooling in the presence of relatively high heat loads. Though turbulent flow provides for relatively efficient heat transfer and cooling, the use of turbulent flow often results in vibrations within a mirror. Vibrations in the mirror may be transmitted throughout a EUV lithography system, thereby compromising the accuracy of lithography processes.

An internally cooled mirror which utilizes a coolant or a cooling fluid that undergoes laminar or non-turbulent flow allows the mirror to be cooled substantially without vibrations being induced. Laminar flow is typically characterized by an organized flow field that has streamlines in which viscous stresses are more significant than fluid inertia stresses. Laminar flow may be described using the Navier-Stokes equation, as will be appreciated by those skilled in the art. In general, laminar flow has a Reynold's number that is less than approximately 2000. It should be appreciated, however, that some fluid flows with Reynold's numbers between approximately 2000 and approximately 4000 may be laminar.

In one embodiment, a fluid that has a Reynold's number of between approximately twenty and approximately seventy may be used as a coolant within an internally cooled mirror.

To substantially maximize the heat transfer from an optical or heated surface of a mirror to a coolant that has a laminar flow, microchannels may be used to support the flow of the coolant. A microchannel is generally a channel which has at least one cross-section with a dimension of approximately 100 micrometers or less. Microchannels generally have a relatively high flow resistance, and a boundary layer that is relatively small and has little effect an insulating layer. A pressure drop associated with a microchannel may be less than approximately twenty kiloPascal (kPa). Typically, a pressure drop is proportional to a flow rate and a length, and is inversely proportional to an area. Such a pressure drop may allow the coolant to flow therethrough, and is not high enough to cause significant deformation in a mirror. When microchannels are relatively short and numerous, pressure supply requirements may be substantially minimized.

Figure 1:
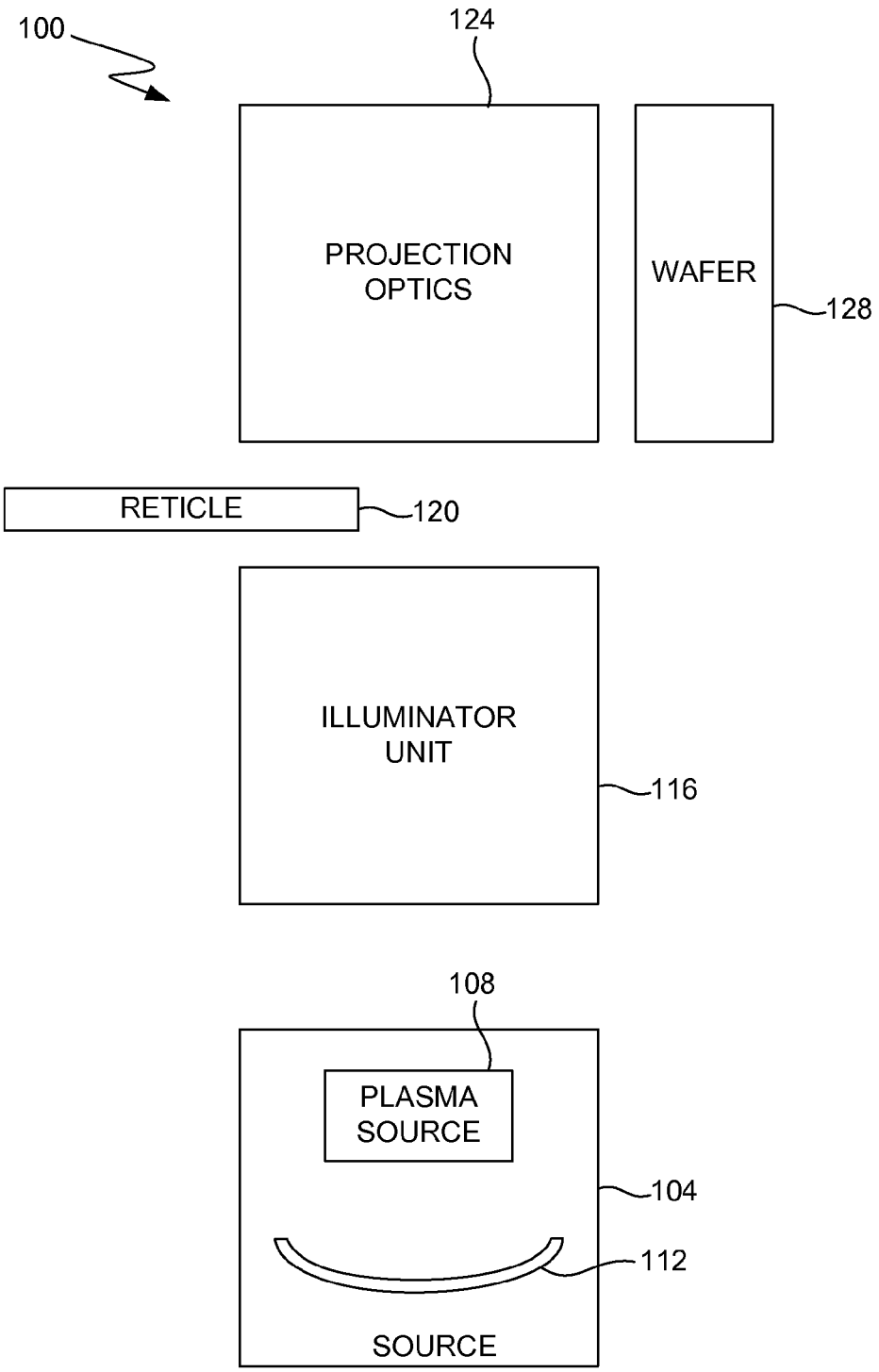
FIG. 1 is a block diagram representation of an extreme ultraviolet (EUV) lithography system.
Figure 2A:
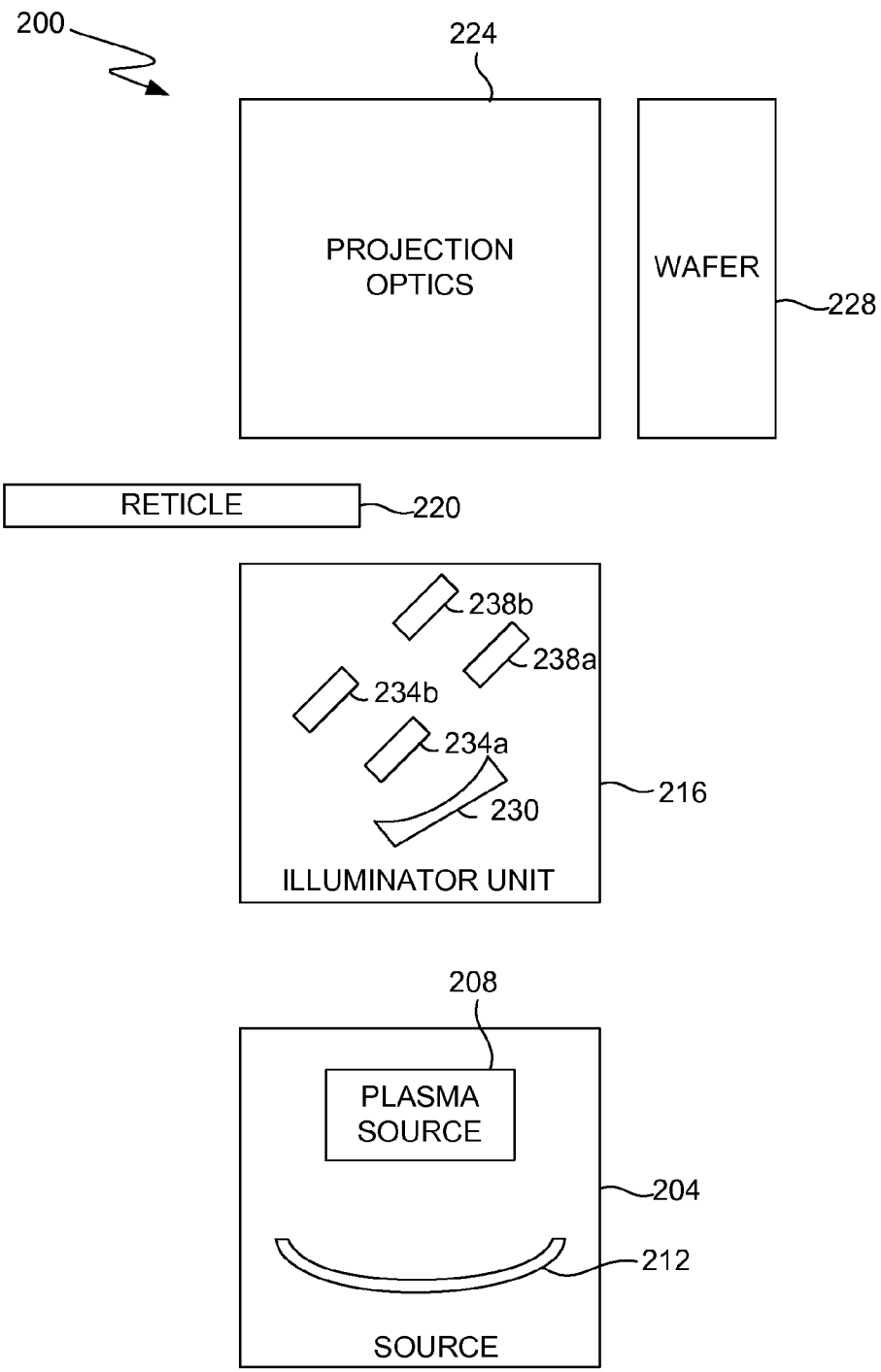
FIG. 2A is a block diagram representation of a EUV lithography system in accordance with an embodiment of the present invention.

With reference to FIG. 2A, a EUV lithography system that includes at least one internally cooled mirror which uses laminar flow in microchannels will be described in accordance with an embodiment of the present invention. A EUV lithography system 200 includes a source 204, an illuminator unit 216, a reticle 220, protection optics 224, and a wafer 228. It should be appreciated that reticle 220 may generally be supported on a reticle positioning stage arrangement, while wafer 228 may generally be supported on a wafer positioning stage arrangement. However, for ease of illustration, a reticle positioning stage arrangement and a wafer positioning stage arrangement are not shown.

Source 204 generally includes a plasma source 208 and a collector mirror 212. Plasma source 208 may use a gas such as Xenon as a laser plasma target material. Plasma source 208 emits light that is collected by collector mirror 212, and passed to illuminator unit 216. Light, or a stream of electrons, that is processed by illuminator unit 216 is reflected off of reticle 220, through projection optics 224, and onto wafer 228.

Illuminator unit 216 includes a collimator mirror 230, a plurality of fly-eye mirrors 234a, 234b, and a plurality of condenser mirrors 238a, 238b. In general, illuminator unit 216 is arranged to condition light emitted by source 204 to improve the uniformity of the light and, hence, the electrons. Light from source 204 is partially absorbed by collimator mirror 230, before being reflected onto fly-eye mirrors 234a, 234b and condenser mirrors 238a, 238b. Fly-eye mirrors 234a, 234b generally have relatively complex-shaped reflective surfaces constructed from many concave mirror elements. Fly-eye mirror 234a receives light reflected off of collimator mirror 230, and reflects light to condenser mirror 238a. In turn, condenser mirror 238a reflects light to fly-eye mirror 234b, which reflects light to condenser mirror 238b.

Figure 2B:
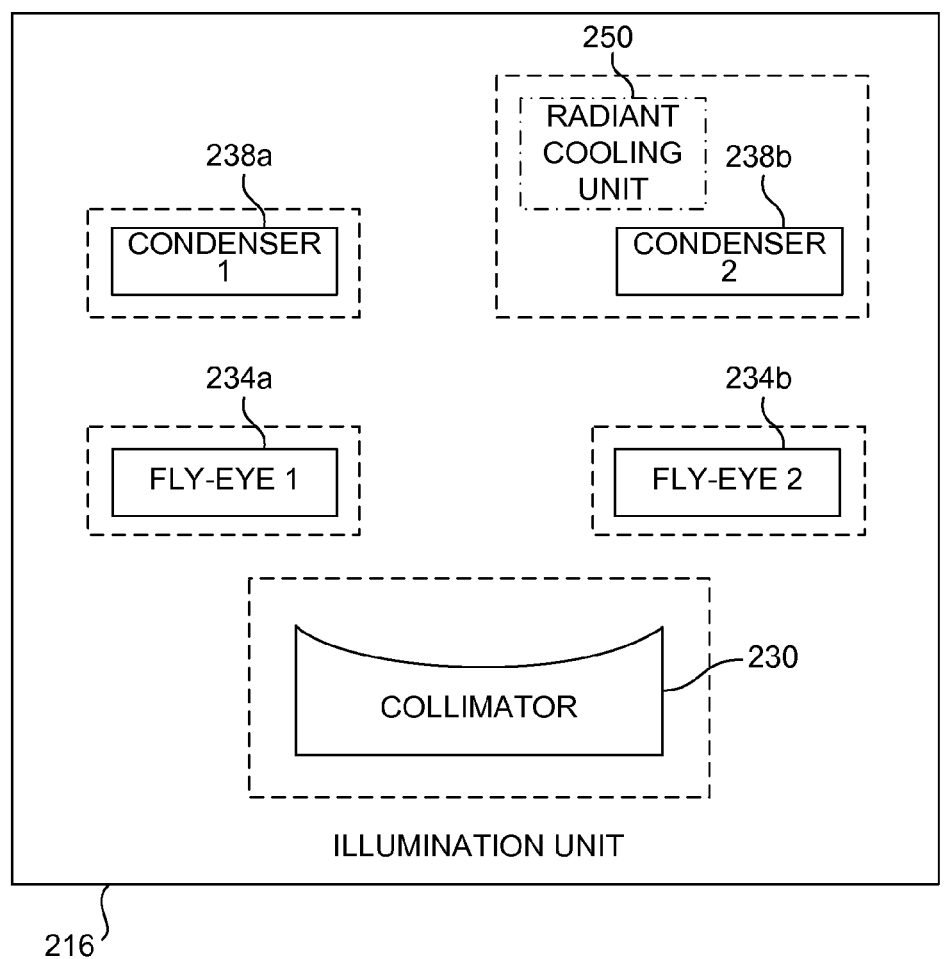
FIG. 2B is a diagrammatic representation of an illuminator unit, i.e., illuminator unit 216 of FIG. 2A, with a liquid-cooled collimator mirror in accordance with an embodiment of the present invention.

Although substantially all mirrors associated with illuminator unit 216 may be internally cooled using cooling fluid that is subjected to laminar flow, some mirrors may be cooled using radiant methods, as will be discussed below with reference to FIG. 2B. Typically, collimator mirror 230 reflects approximately seventy percent of the light or radiation that is incoming to collimator mirror 230. Hence, approximately thirty percent of the light or radiation is absorbed by collimator mirror 230. This thirty percent of light, e.g., approximately 90 Watts of energy in one embodiment, is difficult to cool using radiant methods. Hence, collimator mirror 230 is cooled internally. In one embodiment, collimator mirror 230 is cooled using laminar or non-turbulent fluid flow, to substantially minimize any temperature rise associated with the absorption of heat while also substantially minimizing vibration, curvature distortion, and undulation error. By way of example, the use of a laminar fluid flow in microchannels allows less than an approximately five degree Celcius temperature rise to be maintained, while allowing less than approximately 100 nm of curvature distortion and less than approximately 20 nm of undulation error. Collimator mirror 230, which has a concave surface, is arranged to include microchannels beneath the concave surface which allow a cooling fluid to absorb heat.

As previously mentioned, mirrors in illumination unit 216 may be cooled using a variety of different methods. FIG. 2B is a diagrammatic representation of illuminator unit 216 which illustrates mirrors cooled using different methods in accordance with an embodiment of the present invention. Collimator mirror 230 is internally cooled by a cooling fluid that has a laminar flow through microchannels. Fly-eye mirrors 234a, 234b, in the described embodiment, are also internally cooled. The heat loads associated with fly-eye mirrors 234a, 234b are generally too high to be efficiently cooled using radiant cooling methods, as the surface area associated with fly-eye mirrors 234a, 234b is generally insufficient to enable radiant cooling methods to radiate heat away from fly-eye mirrors 234a, 234b. While fly-eye mirrors 234a, 234b may be internally cooled using microchannels and a fluid with laminar flow properties, it should be appreciated that fly-eye mirrors 234l, 234b may be cooled using substantially any internal cooling method, e.g., a method that involves turbulent fluid flow.

Condenser mirror 238a is also generally internally cooled using substantially any suitable method. Suitable methods include, but are not limited to, a radiant cooling method. Radiant cooling methods may be used to cool condenser mirror 238b. By way of example, a radiant cooling unit 250 such as a radiator may be used to provide cooling to condenser mirror 238b. It should be appreciated that condenser mirror 238b may instead be cooled using internal cooling methods. However, as radiant cooling is typically less complex and less expensive than internal cooling methods, since radiant cooling is adequate for the heat load associated with condenser mirror 238b, radiant cooling is generally used to provide cooling to condenser mirror 238b.

A collimator mirror typically has a concave top surface. Microchannels within the collimator mirror may be arranged to follow the curvature of the top surface, or may be arranged to be substantially straight, i.e., not arranged to follow the curvature of the top surface. In general, having the entire span of each microchannel or cooling channel in a collimator mirror substantially equidistant from the top surface or the optical surface minimizes thermal distortion in the collimator mirror. However, even when the entire span of a microchannel is not substantially equidistant from the top surface, thermal distortion in the collimator mirror is not significant.

Figure 3A:
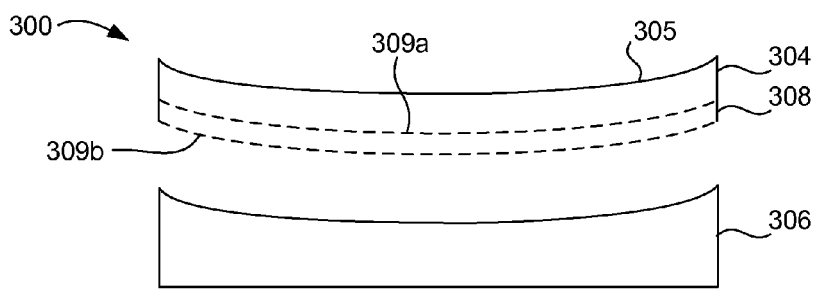
FIG. 3A is a diagrammatic side view representation of a first piece and a second piece of an internally cooled mirror with a concave surface in accordance with a first embodiment of the present invention.

Typically, a collimator mirror is fabricated to have a top piece and a base piece. The top piece generally includes the concave optical surface of the collimator mirror. FIG. 3A is a diagrammatic cross-sectional side view representation of a top piece and a base piece of an internally cooled mirror with a concave surface in accordance with a first embodiment of the present invention. A top piece 304 of a collimator mirror 300 has a concave optical surface 305, and is arranged to be coupled to a base piece 306 of collimator mirror 300. For ease of illustration, top piece 304 and base piece 306 are shown apart, although it should be appreciated that top piece 304 and base piece 306 are generally bonded together when collimator mirror 300 is in use. Any suitable bonding method may be used to couple top piece 304 to base piece 306. Suitable bonding methods include, but are not limited to, brazing, frit bonding, and epoxy bonding.

Top piece 304 and base piece 306 may be formed from any suitable material. Preferably, the material has a relatively high ratio of conductivity to a coefficient of thermal expansion. In other words, a material such as silicon, Zerodur, copper, or Invar which have a relatively high conductivity and a relatively low coefficient of thermal expansion may be used to form collimator mirror 300. A material such as glass may be used to join top piece 304 and base piece 306 together substantially internally and to join the outside edges of top piece 304 and base piece 306. Alternatively, other materials may be used to allow the outside edges of top piece 304 and base piece 306 to be substantially sealed together, as well as to joint top piece 304 and base piece 306 internally. In general, the same material is used for both internal and external bonding surfaces.

Top piece 304 includes at least one cooling channel 308, e.g., at least one microchannel, through which a coolant or cooling fluid may flow. Cooling channel 308 is arranged such that a top 309a and a bottom 309b of cooling channel 308 have approximately the same curvature as optical surface 305. Each cooling channel in top piece 304 may have approximately the same curvature as optical surface 305, and may be arranged to be located at equidistantly from optical surface 305.

Figure 3B:
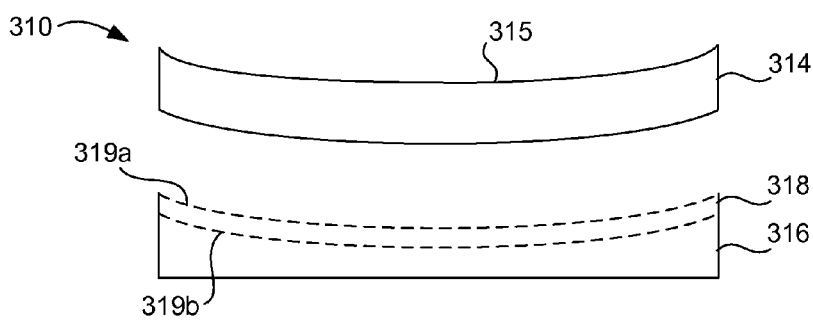
FIG. 3B is a diagrammatic side view representation of a first piece and a second piece of an internally cooled mirror with a concave surface in accordance with a second embodiment of the present invention.

Instead of being formed in a top piece of a collimator mirror, a curved cooling channel may instead be formed in a base piece of the collimator mirror. Although having a cooling channel above the interface between a top piece and a bottom piece of the collimator mirror is generally more efficient, the use of a cooling channel below the interface still allows for a relatively efficient transfer of heat from an optical surface to a cooling fluid. With reference to FIG. 3B, a collimator mirror in which a curved cooling channel is formed in a base portion of the collimator mirror will be described in accordance with an embodiment of the present invention. A collimator mirror 310 has a top piece 314 with a concave optical surface 315 and a bottom piece 316. Bottom piece 316 has a substantially planar top surface, and has a cooling channel 318 formed therethrough. Cooling channel 318 is shaped such that a top 319a and a bottom 319b of cooling channel 318 approximately follow the curvature of optical surface 315.

Figure 3C:
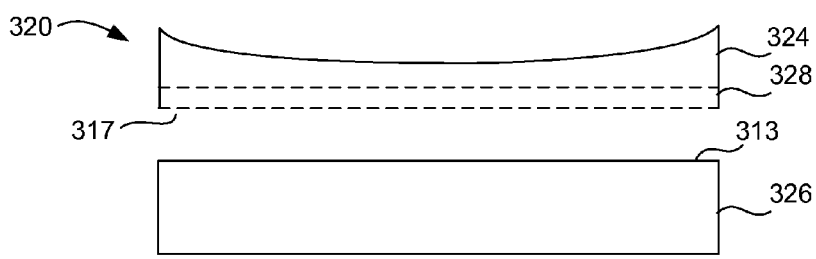
FIG. 3C is a diagrammatic side view representation of a first piece and a second piece of an internally cooled mirror with a concave surface in accordance with a third embodiment of the present invention.
Figure 3D:
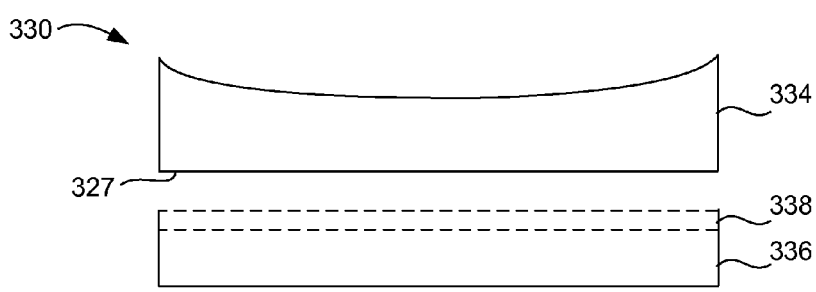
FIG. 3D is a diagrammatic side view representation of a first piece and a second piece of an internally cooled mirror with a concave surface in accordance with a fourth embodiment of the present invention.

In lieu of having curved top and bottom surfaces, a cooling channel may be arranged to have relatively flat top and bottom surfaces. That is, a cooling channel may be arranged such that a top surface of the cooling channel is arranged to be parallel to, or at a substantially fixed distance from, a planar surface of a collimator mirror. Such a cooling channel may either be formed in a top piece of a collimator mirror, or in a base piece of the collimator mirror. As shown in FIG. 3C, a collimator mirror 320 may include a top piece 324 through which a cooling channel 328 is formed that is approximately parallel to a bottom surface 319 of top piece 324. Cooling channel 328 is also approximately parallel to a top surface 313 of a base piece 326. Alternatively, a cooling channel 338 that is approximately parallel to a bottom surface 327 of a top piece 334 of a collimator mirror 330 may be formed in a base piece 336 of collimator mirror 330.

Figure 4A:
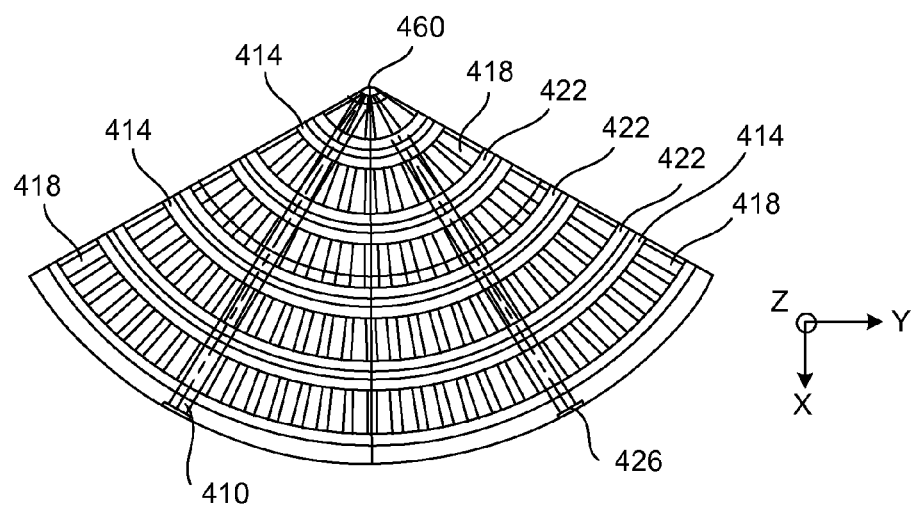
FIG. 4A is a diagrammatic cross-sectional top-view representation of a portion of an internally cooled mirror in accordance with an embodiment of the present invention.
Figure 4B:
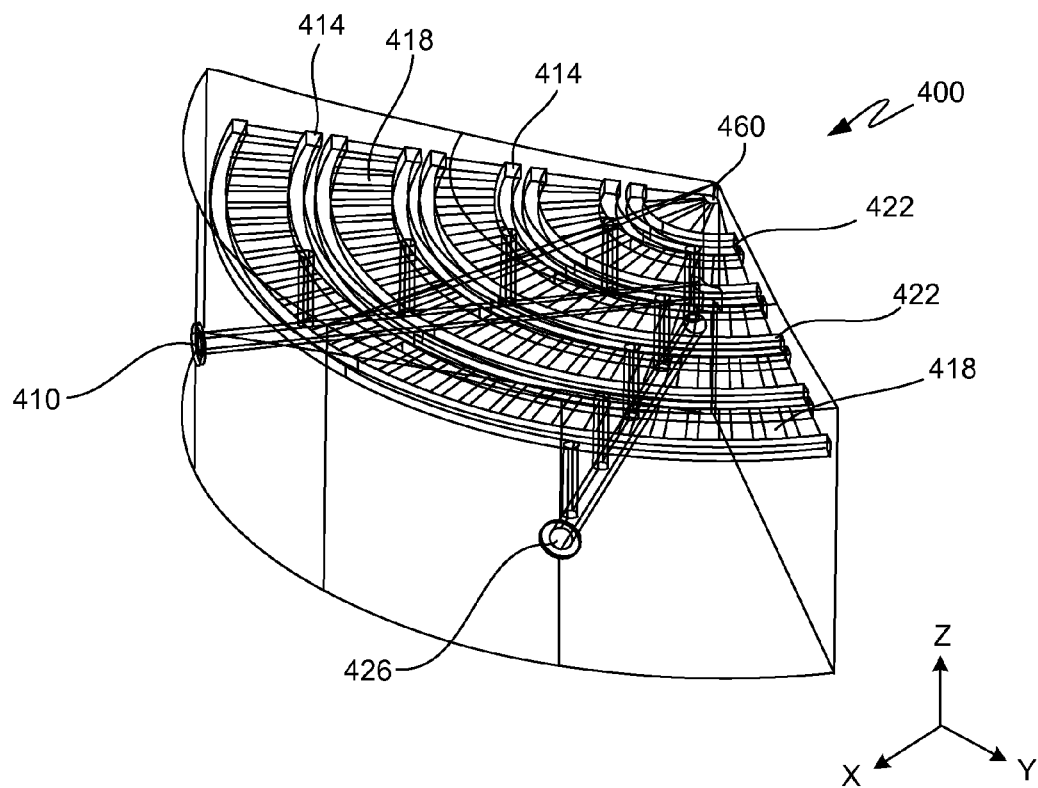
FIG. 4B is a diagrammatic cross-sectional perspective representation of a portion of an internally cooled mirror, i.e., portion 400 of FIG. 4A, in accordance with an embodiment of the present invention.

Cooling channels may generally be arrays of microchannels which have either a polygonal, e.g., approximately rectangular, cross-section or an approximately oval cross-section. FIG. 4A is a diagrammatic cross-sectional top-view representation of a section of an approximately circular internally cooled mirror in accordance with an embodiment of the present invention, while FIG. 4B is a diagrammatic cross-sectional perspective representation of the section in accordance with an embodiment of the present invention. An internally cooled mirror 400, e.g., an internally cooled collimator mirror, includes arrays of microchannels 418 that are arranged about a substantially central point 460. Microchannels 418 are arranged to receive a cooling fluid through feed grooves 414. Feed grooves 414 are supplied through inlet port 410. In general, inlet ports 410 receive cooling fluid from a fluid reservoir (not shown). Heat on a top surface of mirror 400 is absorbed by cooling fluid that is present in microchannels 418. Exit grooves 422 carry heated cooling fluid from microchannels 418 out of mirror 400 via an outlet port 426.

Figure 5:
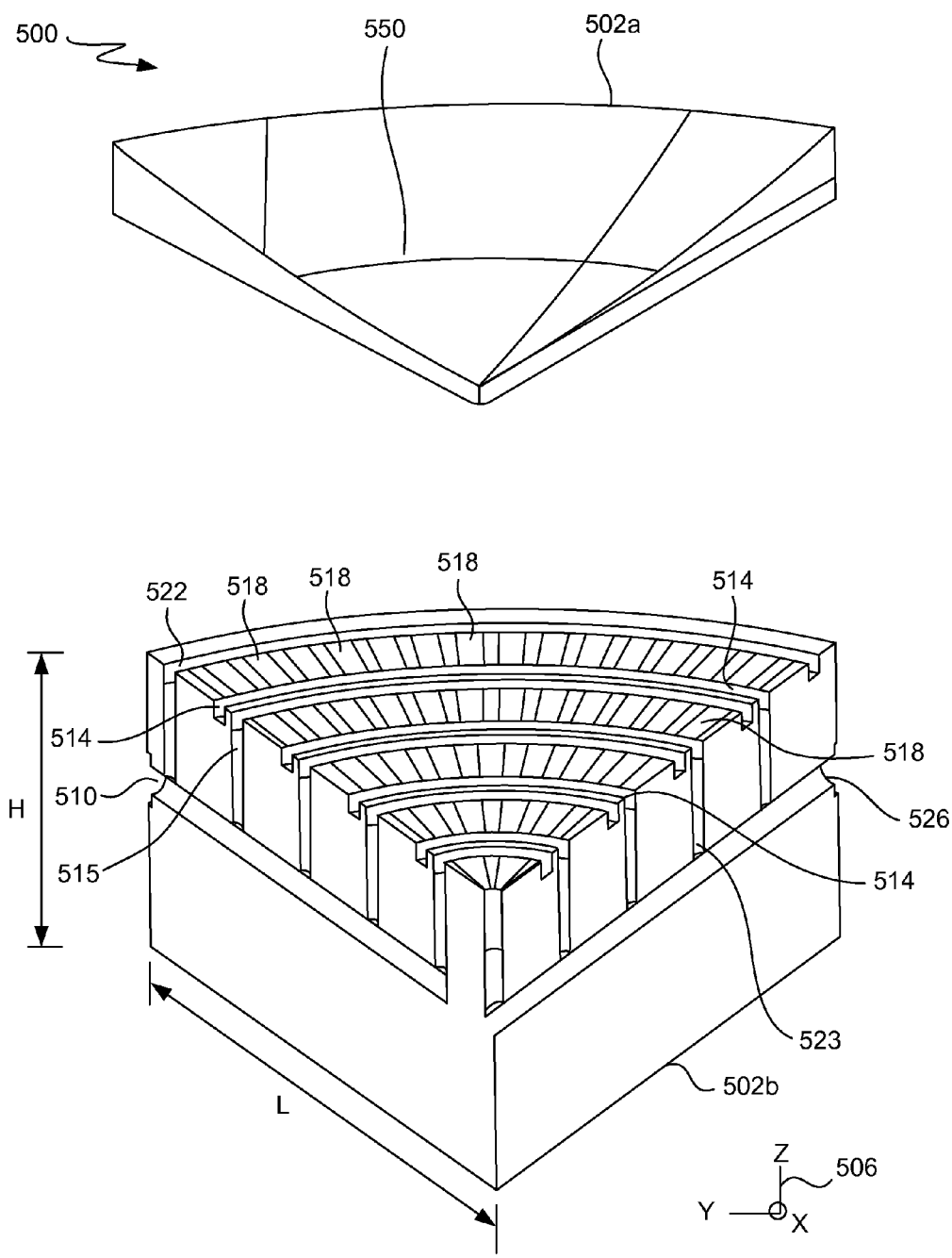
FIG. 5 is a diagrammatic exploded representation of a portion of an internally cooled mirror in accordance with an embodiment of the present invention.

FIG. 5 is a diagrammatic exploded representation of a portion of an internally cooled mirror in accordance with an embodiment of the present invention. In the described embodiment, an overall internally cooled mirror has a round, e.g., substantially circular, footprint. Hence, a portion 500 of an overall internally cooled mirror has a substantially wedge-like shape, with a substantially triangular footprint. Portion 500 includes a top piece 502a and a base piece 502b. As shown, microchannels 518 and grooves 514, 522 are formed in base piece 502b, and are not arranged to have a curvature similar to a z-axis 506 which effectively mirrors the curvature of a spherical surface, in one embodiment. It should be appreciated, however, that grooves or azimuthal channels 514, 522 may instead be formed in top piece 502a, and may have a curvature similar to z-axis 506.

An inlet port 510, which is in fluid communication with feed grooves 514 when fluid flows through inlet port 510 and feed grooves 514, allows fluid to be provided to portion 500. In one embodiment, an overall internally cooled mirror that includes portion 500 may include three inlet ports that are in communication with five radial feed grooves 514. A number of inlet ducts 515 couple inlet port 510 to feed grooves 514. Microchannels 518, which extend off of feed grooves 514, are in fluid communication with both feed grooves 514 and exit grooves 522. Exit grooves 522 allow fluid to flow from microchannels 518 out of portion 500 via an exit port 526. In the described embodiment, an overall internally cooled mirror includes five exit grooves 522 which are coupled to exit ducts 523 that feed three exit ports 526.

The flow resistance associated with microchannels 518 is higher than the flow resistance associated with feed grooves 514 and exit grooves 522. In general, microchannels 518 are arranged in an array and act as a plenum that substantially ensures the uniform flow of fluid through the array. Hence, a relatively uniform heat removal rate is achieved.

Microchannels 518 are arranged, as shown, in approximately five groups. The groups are each oriented as a ring about a center point of an overall internally cooled mirror that includes portion 500. That is, microchannels 518 are radial microchannels that are arranged in an azimuthal array. In general, the number of microchannels 518 and the dimensions associated with microchannels 518 and may vary widely. For example, when an overall internally cooled mirror which includes portion 500 has a base height H of approximately 47 millimeters (mm) and a length L of approximately 100 mm, the overall internally cooled mirror may include approximately 264 microchannels. The approximately 264 microchannels may each be approximately 3 mm wide, approximately 11.5 mm long, and approximately 0.1 mm deep. In order to maintain a relatively small pressure drop within each microchannel 518, many shorter microchannels 518 are used rather than fewer longer microchannels.

The dimensions associated with inlet port 510, exit port 526, and azimuthal grooves 514, 518 may also vary widely.

For example, inlet port 510 and exit port 526 may each be approximately 4.6 mm in height or depth, i.e., relative to z-axis 506, while azimuthal grooves 514, 518 may have heights of approximately 3 mm and widths of approximately 3 mm.

As shown, feed grooves or channels 514 are positioned next to exit grooves or channels 522. Such positioning is arranged to minimize the distortion effects associated with the relatively hot fluid that flows through exit grooves 522 and the relatively cold fluid that flows through feed grooves 514. In one embodiment, a curvature distortion of approximately 100 nanometers (nm) or less for an optical surface is preferred. As heat has the tendency to expand silicon, which is a component of portion 500 in one embodiment, and cold has a tendency to shrink silicon, the placement of feed grooves 514 and exit grooves 522 substantially adjacent to one another may enable the effects of heat and cold to substantially cancel each other out. That is, the placement of feed grooves 514 next to exit grooves 522 allow the temperature in the region of feed grooves 514 and exit grooves 522 to be substantially averaged, thereby effectively minimizing undulation distortion. It should be appreciated that each inlet duct 515 may be positioned substantially adjacent to an outlet duct 523 also to allow the temperature around inlet ducts 515 and outlet ducts 523 to be substantially averaged such that undulation distortion may be minimized.

Figure 6:
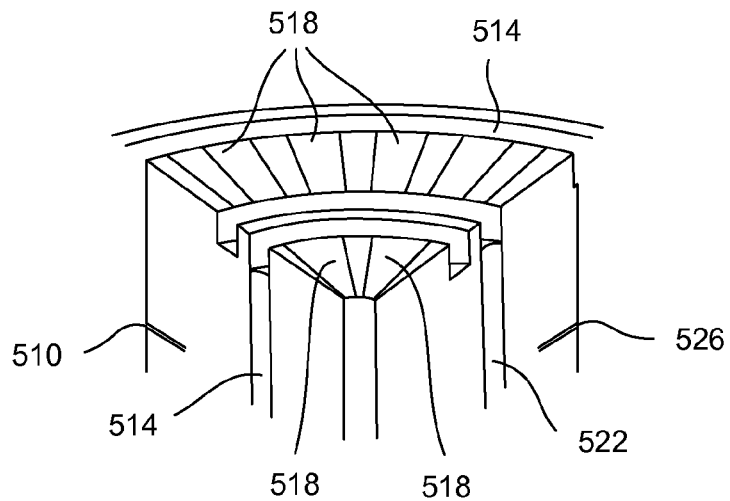
FIG. 6 is a diagrammatic representation of a section of a portion of an internally cooled mirror, i.e., base piece 502b of FIG. 5, in accordance with an embodiment of the present invention.

FIG. 6 is a diagrammatic representation of a section of a portion of an internally cooled mirror, i.e., base piece 502b of FIG. 5, in accordance with an embodiment of the present invention. FIG. 6 shows microchannels 518, feed grooves 514, and exit grooves 522 in more detail than provided in FIG. 5.

Figure 7:
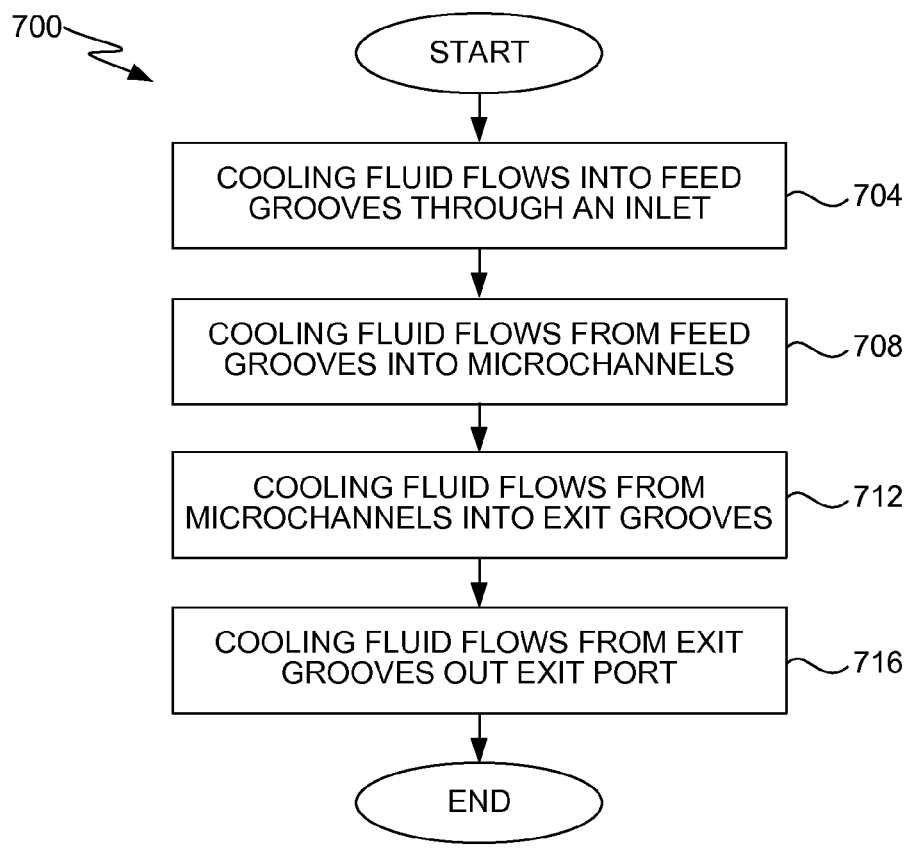
FIG. 7 is a process flow diagram which illustrates one flow path for liquid through an internally cooled mirror in accordance with an embodiment of the present invention.

With reference to FIG. 7, one flow path for liquid or fluid through an internally cooled mirror will be described in accordance with an embodiment of the present invention. A process 700 of circulating a cooling fluid through an internally cooled mirror with microchannels begins at step 704 in which the cooling fluid, or a fluid which absorbs heat and effectively cools the mirror, flows into feed grooves through an inlet. The cooling fluid may be any suitable fluid that is conductive, and is characterized by a relatively high heat or thermal capacity.

As shown in FIGS. 5 and 6, inlet 510 is arranged to allow cooling fluid to flow into feed grooves 514, as for example via ducts. In the described embodiment, the cooling fluid is subject to laminar flow. The cooling fluid flows from feed grooves into microchannels in step 708. After flowing through microchannels, the cooling fluid flows into exit grooves in step 712. The exit groups are in fluid communication with an exit port, e.g., through ducts, and the cooling fluid flows in step 716 from the exit grooves out the exit port. Once the cooling fluid flows out of the exit port, the process of circulating a cooling fluid through an internally cooled mirror is completed.

Figure 8:
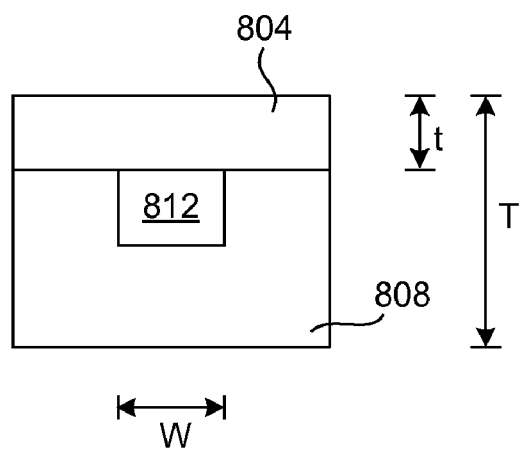
FIG. 8 is a block diagram cross-sectional side-view representation of a section of an internally cooled mirror in accordance with an embodiment of the present invention.

The size and orientation of microchannels within an internally cooled mirror may vary widely. With reference to FIG. 8, the relative dimensions associated with a top piece, a base piece, and a microchannel of an internally cooled mirror will be described in accordance with an embodiment of the present invention. A top piece 804 is arranged to be coupled to a base piece 808 in which a microchannel 812 is formed. Though microchannel 812 is shown as having an approximately rectangular cross-section, it should be appreciated that microchannel 812 may have substantially any cross-sectional shape, e.g., an oval shape.

Dimensions such as a thickness t of top piece 804, a thickness T of base piece 808, and a width W of microchannel 812 may be selected to substantially minimize at least one of distortion resulting from internal pressure and distortion caused by polishing pressure applied to create a mirrored surface on top piece 804. By way of example, when width W is too large, top piece 804 may experience excessive bowing. In one embodiment, a ratio of thickness t to thickness T may be substantially minimized, while maintaining a ratio of thickness t to width W that is greater than or equal to one. Minimizing a ratio of thickness t to thickness T allows bowing distortion in top piece 804 due to differential thermal expansion to be reduced.

In one embodiment, thickness t may be between approximately three mm and approximately ten mm, although thickness t may be widely varied. As previously discussed, top piece 804 may have a substantially concave shape. The shallowest part of top piece 804 may be approximately three mm thick, while the thickest part of top piece 804 may be approximately ten mm thick. Thickness T may also vary widely and, as previously mentioned, may be approximately 47 mm.

Figure 9A:
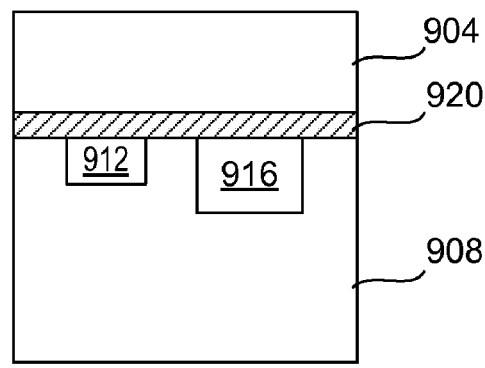
FIG. 9A is a block diagram cross-sectional side-view representation of a section of an internally cooled mirror in which microchannels and azimuthal grooves are present in a base piece of an internally cooled mirror in accordance with an embodiment of the present invention.

Microchannels and azimuthal channels may be machined into either or both a base piece and a top piece of an internally cooled mirror. FIG. 9A is a block diagram cross-sectional side-view representation of a section of an internally cooled mirror in which microchannels and azimuthal channels are present in a base piece in accordance with an embodiment of the present invention. A top piece 904 is joined to a base piece 908 which includes a microchannel 912 and an azimuthal channel 916 which may be a feed groove or an exit groove. A layer 920 such as a glass layer allows top piece 904 to be joined to base piece 908. In one embodiment, layer 920 may be considered to be a cooling plane. The closer layer 920 is to a top surface of top piece 904, the lower a differential thermal distortion effect may be. When microchannel 912 and azimuthal channel 916 are in base piece 916, heat applied to a top surface of top piece 904 passes through top piece 904 and layer 920 before being absorbed by a coolant flowing through microchannel 912.

Figure 9B:
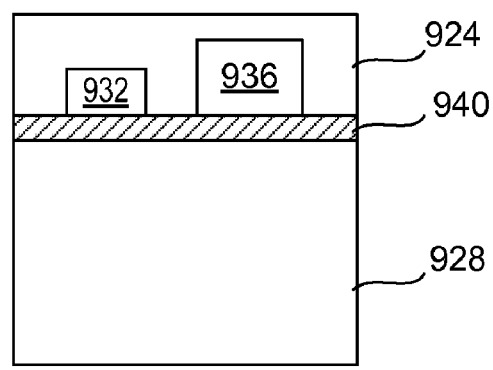
FIG. 9B is a block diagram cross-sectional side-view representation of a section of an internally cooled mirror in which microchannels and azimuthal grooves are present in a top piece of an internally cooled mirror in accordance with an embodiment of the present invention.

FIG. 9B is a block diagram cross-sectional side-view representation of a section of an internally cooled mirror in which microchannels and azimuthal channels are present in a top piece of an internally cooled mirror in accordance with an embodiment of the present invention. A top piece 924 includes a microchannel 932 and an azimuthal channel 936. As microchannel 932 and azimuthal channel 936 are in top piece 924 and, hence, above both a joining layer 940 and a base piece 928, any heat from a top surface of top piece 924 reaches coolant in microchannel 932 without having to pass through to base piece 928. However, the thickness of top piece 924 may need to be increased in order to accommodate azimuthal channel 936, which often has a height that is thicker than that of microchannel 932.

Figure 9C:
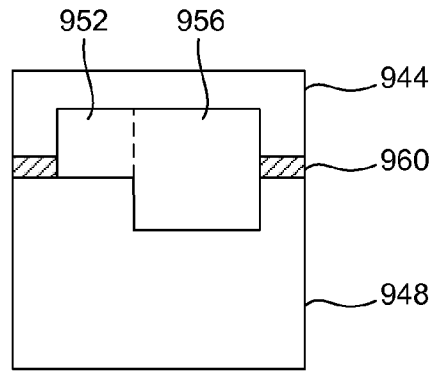
FIG. 9C is block diagram cross-sectional side-view representation of a section of an internally cooled mirror in which azimuthal grooves are defined by both top piece and a bottom piece of an internally cooled mirror in accordance with an embodiment of the present invention.

In one embodiment, an azimuthal channel may be arranged to be defined by both a top piece and a base piece of an internally cooled mirror while a microchannel is defined in the top piece. FIG. 9C is block diagram cross-sectional side-view representation of a section of an internally cooled mirror in which an azimuthal channel is defined by both top piece and a base piece of an internally cooled mirror in accordance with an embodiment of the present invention. A top piece 944 and a base piece 948 are arranged such that when a joining layer 960 is used to bond top piece 944 to base piece 948, an azimuthal channel 956 is defined. In other words, part of azimuthal channel 956 is formed in top piece 944 while another part of azimuthal channel 956 is formed in base piece 948. A microchannel 952 is defined in top piece 944.

When azimuthal channel 956 is partially defined in top piece 944 and partially defined in base piece 948, microchannel 952 may be formed in top piece 944 without the thickness of top piece 944 being increased to accommodate the overall height of azimuthal channel 956. Although microchannel 952 is shown as being defined within top piece 944, it should be appreciated that microchannel 952 may instead be formed partially in top piece 944 and partially in base piece 948, or even substantially completely in bottom piece 948.

Figure 10:
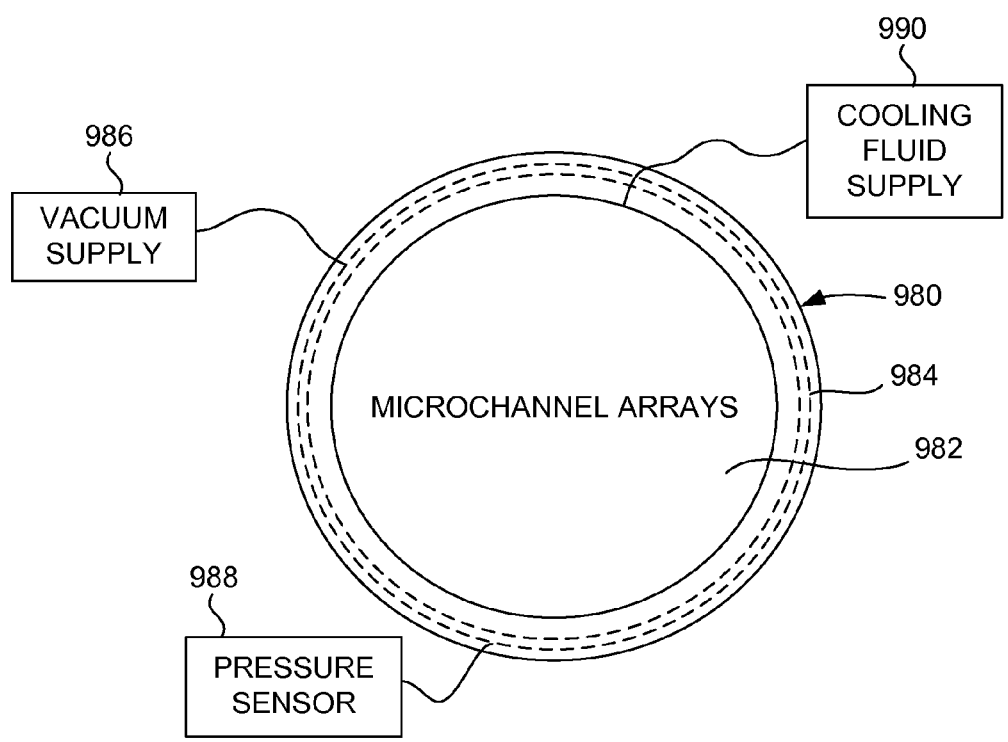
FIG. 10 is a diagrammatic representation of an internally cooled mirror system that includes a vacuum groove and a pressure sensor in accordance with an embodiment of the present invention.

An internally cooled mirror that includes microchannels may be arranged to include at least one vacuum channel that is arranged to facilitate a determination of whether there is leakage of coolant within the internally cooled mirror. The leakage of coolant may cause a significant change in the pressure within the microchannels, and have an adverse effect on the internal cooling of the mirror. To enable any leakage associated with an internally cooled mirror to be detected, a monitored vacuum channel may be included in the mirror. Such a monitored vacuum channel may be arranged to indicate when there is a leak in a weld or a frit bond of the mirror. With reference to FIG. 10, an internally-cooled mirror which includes a vacuum channel will be described in accordance with an embodiment of the present invention. A mirror 980 includes microchannel arrays 982 that contain a cooling fluid supplied by a cooling fluid supply 990. A channel 984 between an outer edge of mirror 980 and microchannel arrays 982 is coupled to a vacuum supply 986, and arranged to contain a vacuum. A pressure sensor 988 is arranged to monitor the pressure level in channel 984. If the pressure in channel 984 changes, the indication may be that coolant is leaking into channel 984.

Figure 15A:
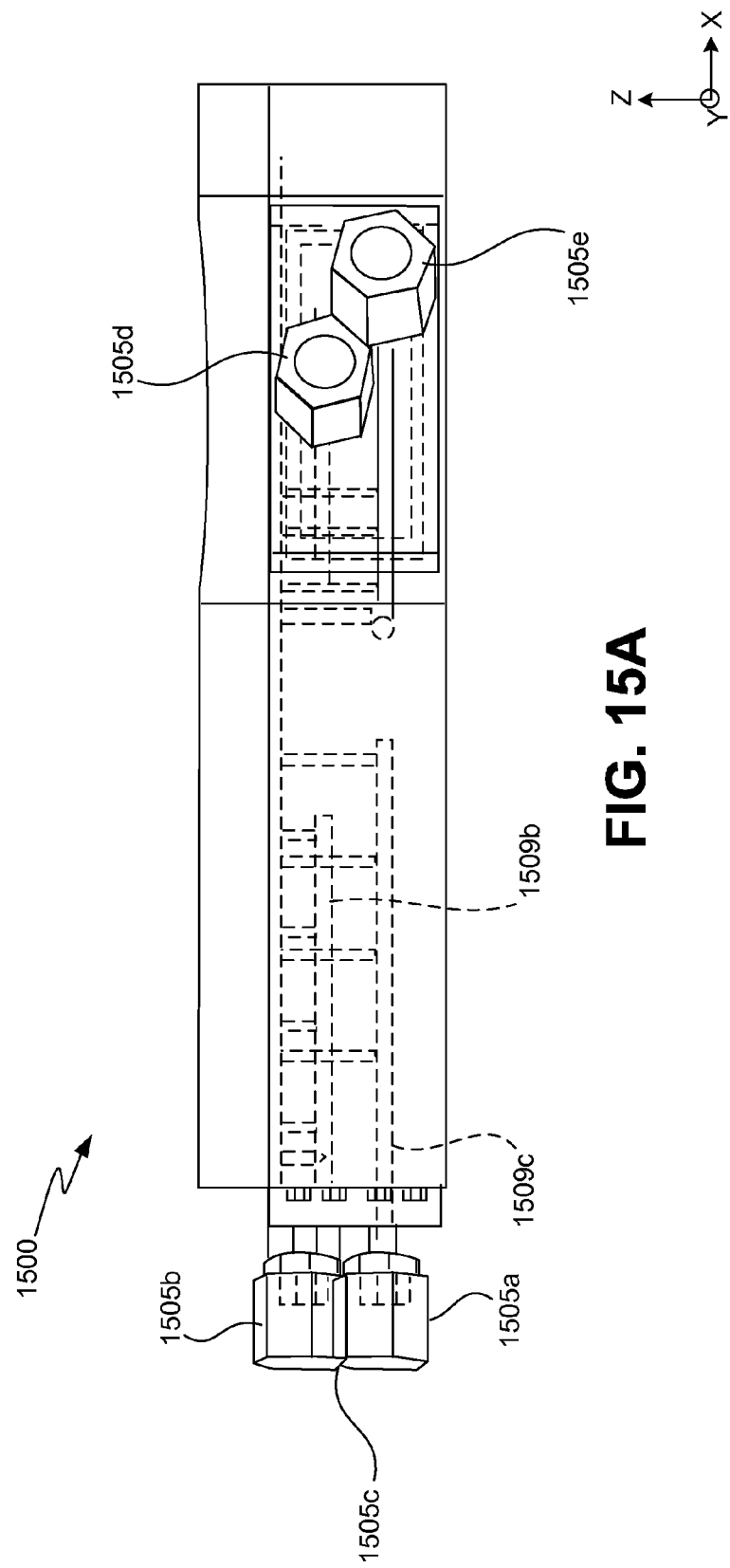
FIG. 15A is a diagrammatic side-view representation of an internally cooled mirror assembly that includes a vacuum groove in accordance with an embodiment of the present invention.
Figure 15B:
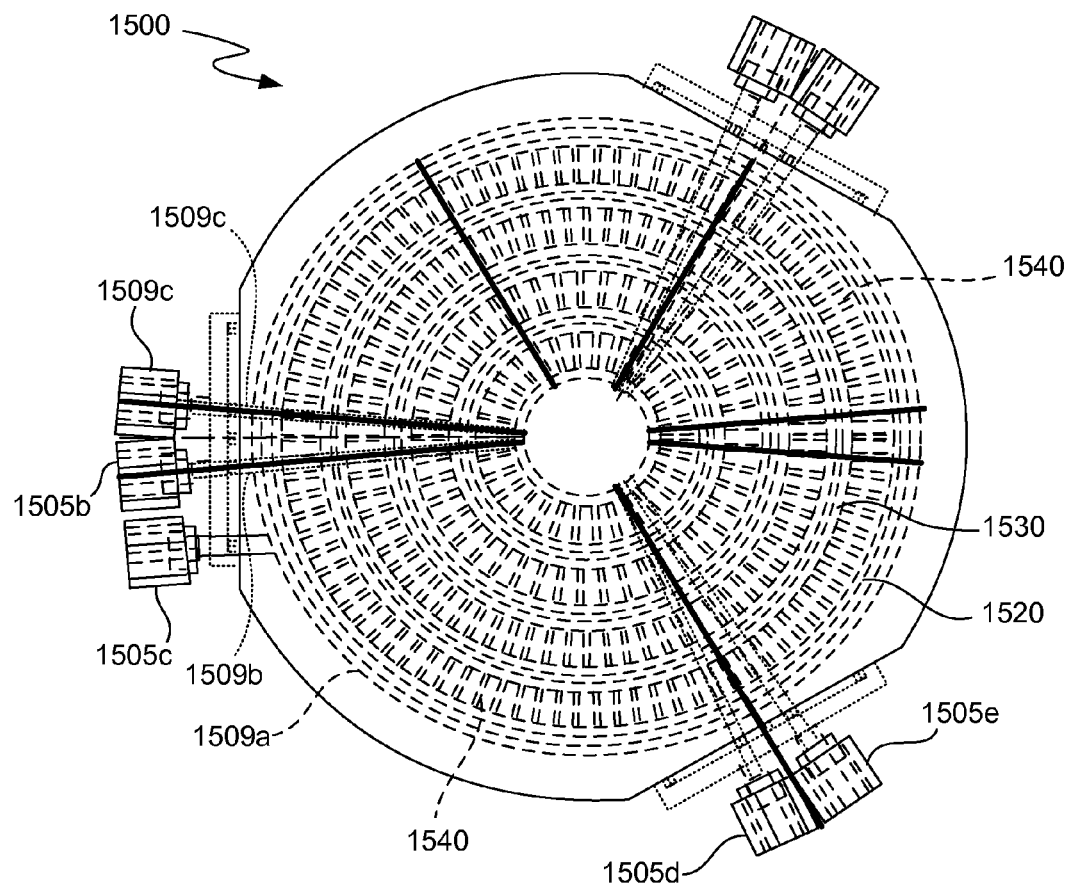
FIG. 15B is diagrammatic top-view representation of an internally cooled mirror assembly that includes a vacuum groove, e.g., mirror assembly 1500 of FIG. 15A, in accordance with an embodiment of the present invention.

FIG. 15A is a diagrammatic side-view representation of an internally-cooled mirror assembly that includes a vacuum channel, and FIG. 15B is a diagrammatic top-view representation of the internally-cooled mirror assembly in accordance with an embodiment of the present invention. Mirror assembly 1500 includes external couplings 1505a-e which are coupled to various supply ports grooves 1509b, 1509c as well as a vacuum groove 1509a of mirror assembly 1500. Coupling 1505c is coupled to an inlet groove 1509c, coupling 1505b is coupled to an outlet groove 1509b, and coupling 1505a is coupled to a vacuum groove 1509a. Couplings 1505a-e generally allow flow into and out of channels 1509a-c to be substantially controlled. For example, coupling 1505a allow a vacuum supply (not shown) to be coupled to vacuum groove 1509a.

Figure 15C:
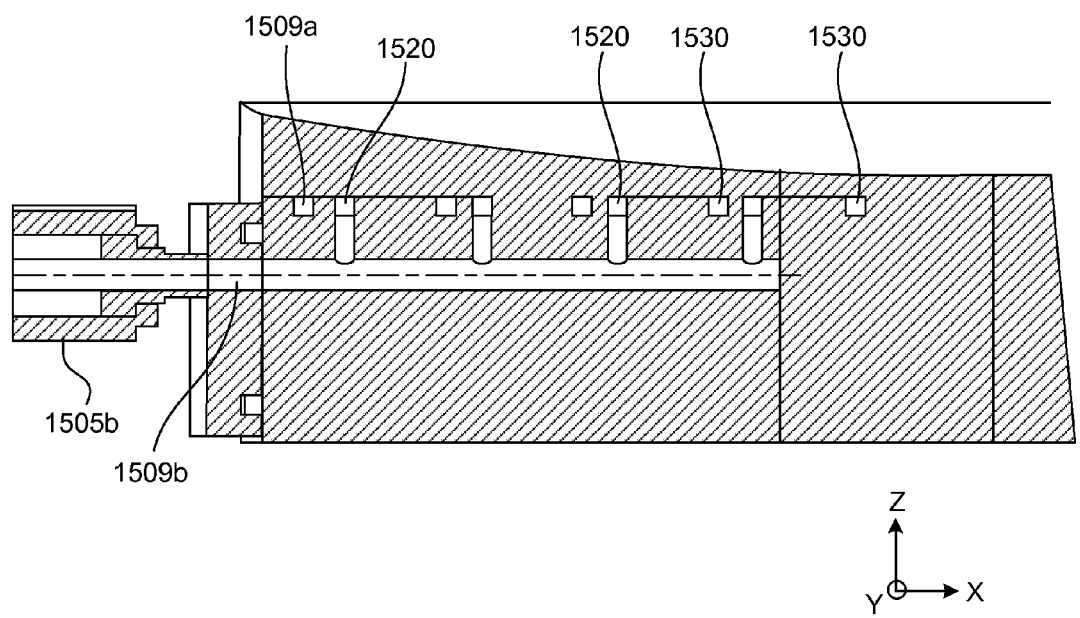
FIG. 15C is a diagrammatic cross-sectional side-view representation of a portion of a mirror assembly, e.g., mirror assembly 1500 of FIG. 15A, in accordance with an embodiment of the present invention.

As shown in FIG. 15C, which is a diagrammatic cross-sectional side-view representation of a portion of mirror assembly 1500, coupling 1505b which is coupled to outlet groove 1509b is in fluid communication with exit grooves 1520. Feed grooves 1530 are coupled to inlet groove 1509c. Both exit grooves 1520 and feed grooves 1530 are in fluid communication with microchannels 1540, as shown in FIG. 15B.

Figure 11A:
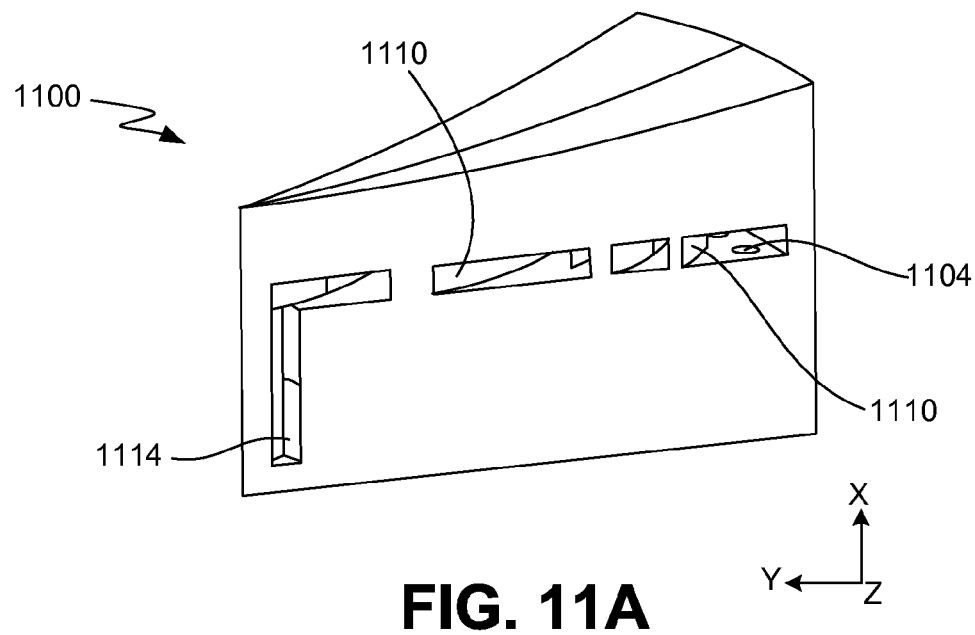
FIG. 11A is a diagrammatic representation of a portion of an internally cooled mirror which includes vanes and utilizes laminar flow in accordance with an embodiment of the present invention.
Figure 11B:
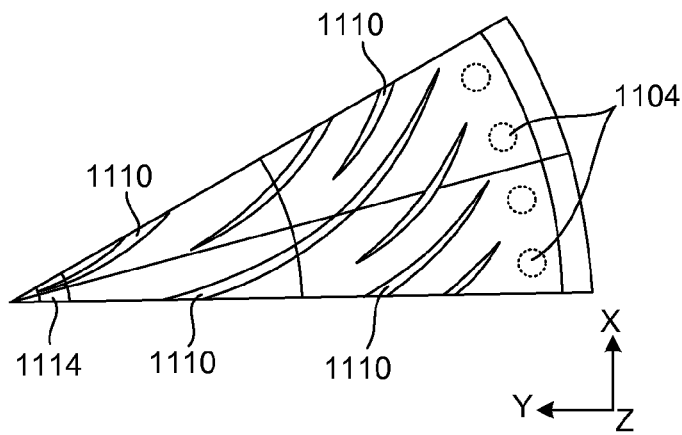
FIG. 11B is a diagrammatic cross-sectional top-view representation of an internally cooled mirror which includes vanes and utilizes laminar flow, i.e., portion 1100 of FIG. 1A, in accordance with an embodiment of the present invention.

While microchannel arrays successfully support laminar flow and allow a mirror to be internally cooled, other configurations may also support a laminar flow within a mirror. By way of example, vanes may be implemented in an internally cooled mirror. FIG. 11A is a diagrammatic representation of a portion of an internally cooled mirror which includes vanes and utilizes laminar flow in accordance with an embodiment of the present invention. FIG. 11B is a diagrammatic cross-sectional top-view representation of the portion of FIG. 11A. A portion 1100 of a mirror includes an inlet or feed channels 1104 that supplies a cooling fluid to an interior of portion 1100. Vanes 1110 within portion 1100 are arranged to allow the flow of coolant to accelerate, thereby preventing flow stagnation and localized hot spots. Outlet or exit channels 1104 allow the cooling fluid to exit portion 1100 once the cooling fluid has been heated. Vanes 1110, as shown, may have a curvature. The curvature is generally arranged to generate secondary flow within the cooling fluid such that convective heat transfer between a top surface of portion 1100 and the cooling fluid may occur.

Figure 12A:
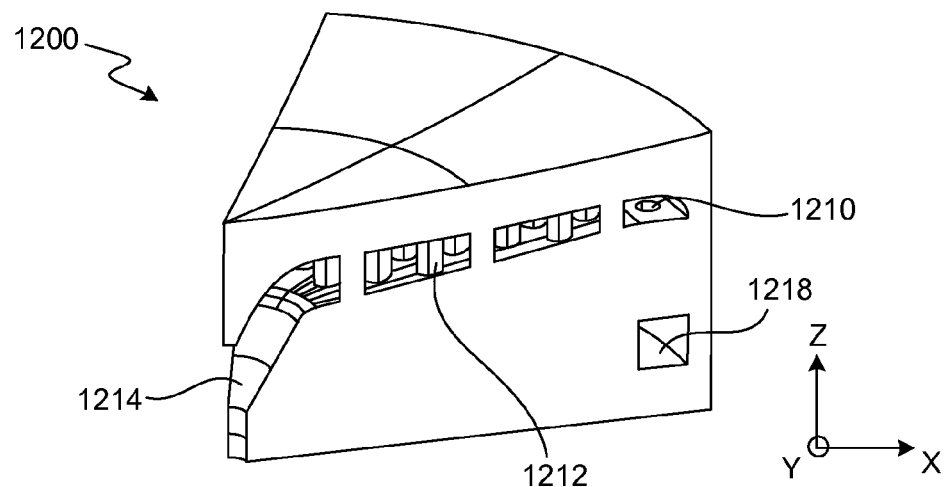
FIG. 12A is a diagrammatic representation of a portion of an internally cooled mirror which includes pins and utilizes laminar flow in accordance with an embodiment of the present invention.
Figure 12B:
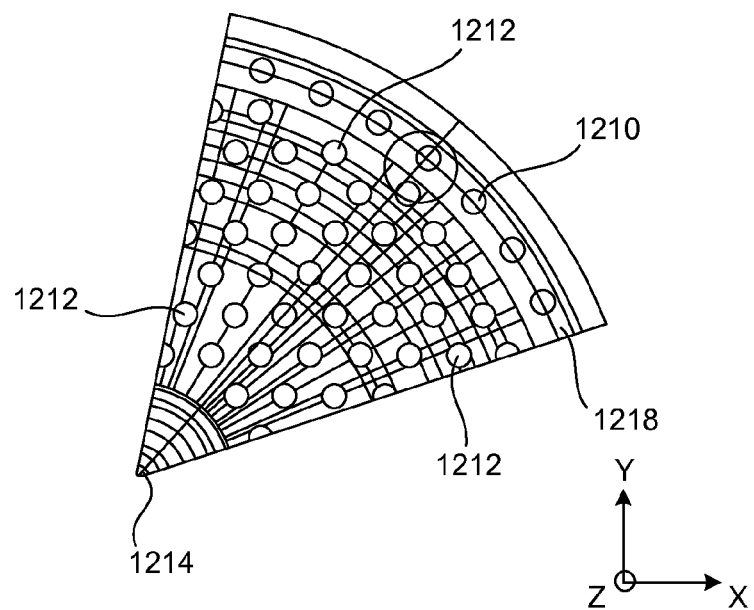
FIG. 12B is a diagrammatic cross-sectional top-view representation of an internally cooled mirror which includes pins and utilizes laminar flow, i.e., portion 1200 of FIG. 12A, in accordance with an embodiment of the present invention.

To increase the surface area associated with the flow of a cooling fluid through an internally cooled mirror, pins may be implemented within the mirror. FIG. 12A is a diagrammatic representation of a portion of an internally cooled mirror which includes pins and utilizes laminar flow in accordance with an embodiment of the present invention. FIG. 12B is a diagrammatic cross-sectional top-view representation of the portion of FIG. 12A. A portion 1200 of an internally cooled mirror includes a feed channel 1210 which provides a cooling fluid that flows around pins 1212. The fluid flows out of portion 1200 via exit channels 1214 that are in fluid communication with an exit channel 1218. The use of pins 1212 allows for an increased heat transfer surface area as the area within portion 1200 which is arranged to contain a cooling fluid is increased in comparison to the use of microchannels or vanes.

A EUV lithography system that utilizes an internally cooled collimator mirror with microchannels includes a vacuum chamber with pumps which are arranged to enable a desired vacuum level to be maintained within the vacuum chamber 902. Typically, a EUV lithography system includes components such as stages, illumination units, a reaction frame, a vibration isolation mechanism, actuators, and controllers.

Movement of a wafer stage assembly and a reticle stage assembly of a EUV lithography system generates reaction forces which may affect performance of the EUV lithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by motion of reticle stage assembly 910 may be mechanically released to the floor (ground) by use of a frame member as described in U.S. Pat. No. 5,874,820 and published Japanese Patent Application Disclosure No. 8-330224, which are each incorporated herein by reference in their entireties.

A EUV lithography system according to the above-described embodiments, e.g., a lithography apparatus which may include an internally cooled collimator mirror, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 13:
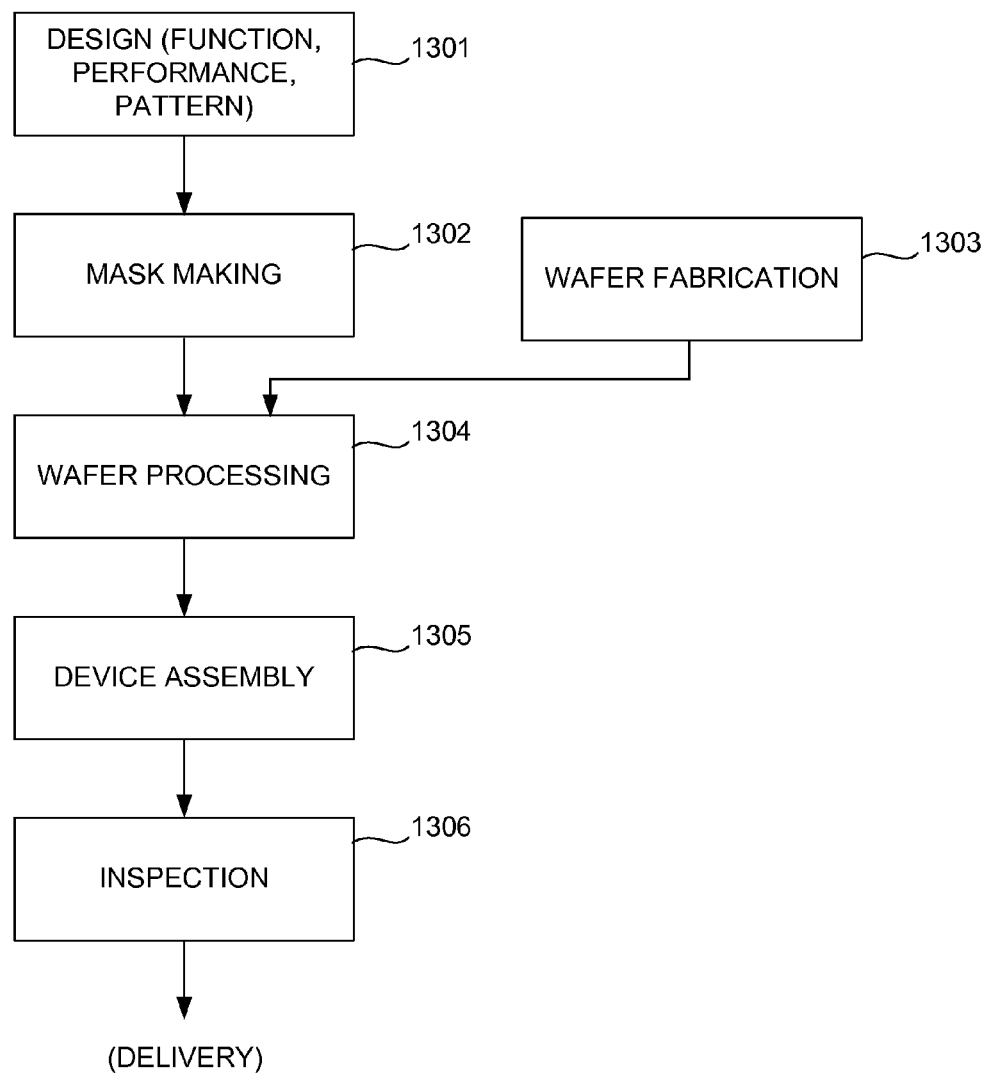
FIG. 13 is a process flow diagram which illustrates the steps associated with fabricating a semiconductor device in accordance with an embodiment of the present invention.

Further, semiconductor devices may be fabricated using systems described above, as will be discussed with reference to FIG. 13. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 14. In step 1305, the semiconductor device is assembled. The assembly of the semiconductor device generally includes, but is not limited to, wafer dicing processes, bonding processes, and packaging processes. Finally, the completed device is inspected in step 1306.

Figure 14:
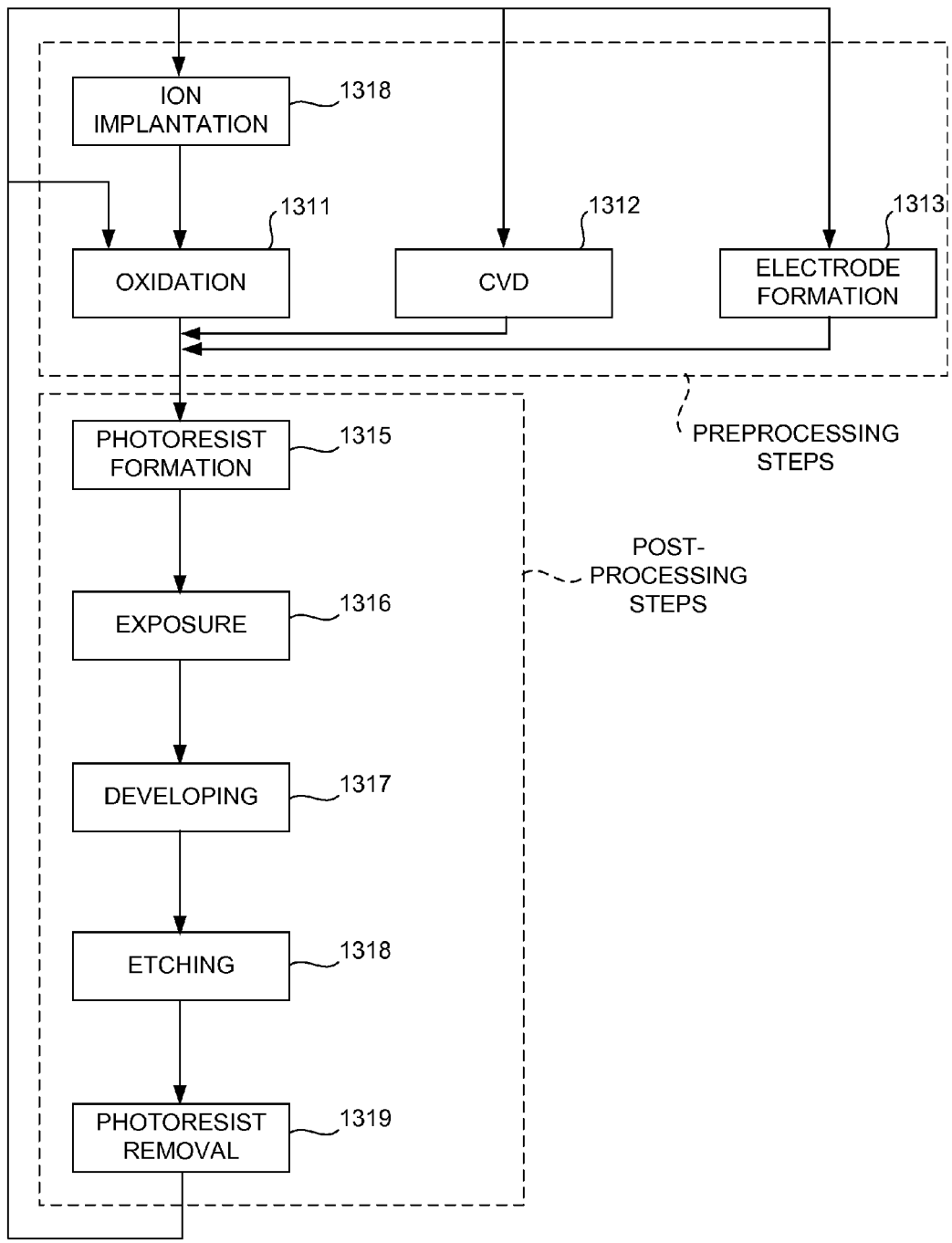
FIG. 14 is a process flow diagram which illustrates the steps associated with processing a wafer, i.e., step 1304 of FIG. 13, in accordance with an embodiment of the present invention.

FIG. 14 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, while a collimator mirror has generally been described as having a top piece and a base piece, a collimator mirror may be formed from any number of pieces. A collimator mirror may be formed from more than two pieces. Alternatively, a collimator mirror may be fabricated as a substantially single piece.

A base piece of a collimator mirror has been described as having a substantially planar top surface, while a top piece of a collimator mirror has been described as having a substantially planar bottom surface. In one embodiment, the top surface of a base piece of a collimator mirror and the bottom surface of a top piece of the collimator may have approximately the same curvature as an optical surface of the top piece.

The orientation of microchannels within an internally cooled mirror may vary widely. In addition to the sizes of the microchannels being variable, the arrangement of the microchannels is variable. For example, in lieu of rings of relatively short microchannels that allow for only a small pressure drop within the microchannels, longer microchannels may be implemented in an internally cooled mirror. At least one spirally oriented microchannel may also be incorporated in an internally cooled mirror.

The use of microchannels is not limited to a collimator mirror. For instance, microchannels may be implemented in fly-eye mirrors or condenser mirrors. Similarly, the use of laminar or non-turbulent flow in a mirror is not limited to use in a collimator mirror, as a laminar flow may be used to provide internal cooling to mirrors such as fly-eye mirrors and condenser mirrors.

Microchannels of a mirror, in one embodiment, each have approximately the same width, the same height, and the same length. The use of microchannels with substantially the same dimensions allows for relatively uniform heat removal, as the incident radiation on an optical surface of the mirror is approximately uniform. However, the dimensions associated with microchannels and arrays of microchannels may be varied to compensate for any non-uniformity in the incident radiation. That is, the heat transfer rate associated with a mirror may be varied across the optical surface of the mirror by implementing different dimensions and layouts for microchannels without departing from the spirit or the scope of the present invention. Therefore, the present examples are to be considered as illustrative and not restrictive, and the invention is not to be limited to the details given herein, but may be modified within the scope of the appended claims.

The invention claimed is:

1. An internally cooled mirror, comprising:
   an optical surface, the optical surface being arranged to reflect and to absorb light;
   at least one microchannel, the at least one microchannel being arranged beneath the optical surface; and
   at least one port, the at least one port being arranged to supply a fluid to the at least one microchannel, wherein the fluid is subjected to a laminar flow in the at least one microchannel and is arranged to absorb heat associated with the light absorbed by the optical surface.

2. The internally cooled mirror of claim 1 wherein the at least one microchannel is in fluid communication with a first azimuthal channel that provides the fluid to the at least one microchannel and a second azimuthal channel that removes the fluid from the at least one microchannel, the first azimuthal channel being coupled to the at least one port.

3. An internally cooled mirror comprising:
   an optical surface, the optical surface being arranged to reflect and to absorb light;
   at least one microchannel, the at least one microchannel being arranged beneath the
   optical surface, wherein the at least one microchannel includes an azimuthal array of radial microchannels; and
   at least one port, the at least one port being arranged to supply a fluid to the at least one microchannel, wherein the fluid is subjected to a laminar flow and is arranged to absorb heat associated with the light absorbed by the optical surface.

4. The internally cooled mirror of claim 3 wherein each microchannel of the azimuthal array is approximately 3 millimeters (mm) wide, approximately 12 mm long, and approximately 0.1 mm high.

5. The internally cooled mirror of claim 3 wherein the array of radial microchannels includes approximately 264 microchannels.

6. The internally cooled mirror of claim 1 wherein the optical surface is a concave optical surface with a radius of curvature of approximately 600 millimeters.

7. The internally cooled mirror of claim 1 wherein the fluid has a Reynold's number of between approximately 20 and approximately 70.

8. The internally cooled mirror of claim 1 wherein a pressure drop within the at least one microchannel when the fluid is contained within the at least one microchannel is less than approximately twenty kiloPascal (kPa).

9. The internally cooled mirror of claim 1 further including:
a leak sensing arrangement, the leak sensing arrangement including a vacuum channel and a sensor, wherein the sensor is arranged to identify if a pressure in the vacuum channel changes.

10. The internally cooled mirror of claim 1 wherein the internally cooled mirror is a collimator mirror of an extreme ultraviolet (EUV) lithography system.

11. A device manufactured with the EUV lithography system of claim 10.

12. An internally cooled mirror, comprising:
an optical surface, the optical surface being arranged to reflect and to absorb light;
at least one microchannel, the at least one microchannel being arranged beneath the optical surface; and
at least one port, the at least one port being arranged to supply a fluid to the at least one microchannel, wherein the at least one microchannel is in fluid communication with a first azimuthal channel that provides the fluid to the at least one microchannel and a second azimuthal channel that removes the fluid from the at least one microchannel, the first azimuthal channel being coupled to the at least one port, and wherein the at least one microchannel includes an azimuthal array of radial microchannels.

13. The internally cooled mirror of claim 3 wherein the internally cooled mirror has a center point, and the azimuthal array of radial microchannels is an array of microchannels oriented in rings about the center point.

14. The internally cooled mirror of claim 3 wherein the at least one microchannel is in fluid communication with a first azimuthal channel that provides the fluid to the at least one microchannel and a second azimuthal channel that removes the fluid from the at least one microchannel, the first azimuthal channel being coupled to the at least one port.

15. The internally cooled mirror of claim 3 wherein the internally cooled mirror is a collimator mirror of an extreme ultraviolet (EUV) lithography system.

16. A device manufactured with the EUV lithography system of claim 15.

17. The internally cooled mirror of claim 1 wherein the optical surface is a concave surface having a curvature, and the at least one microchannel has approximately a same curvature as the concave surface.

18. The internally cooled mirror of claim 1 wherein the at least one microchannel includes has a span, and wherein approximately all of the span is equidistant from a top surface of the optical surface.

19. The internally cooled mirror of claim 12 wherein the optical surface is a concave surface with a first curvature, and the at least one microchannel has a span with a second curvature, the second curvature be approximately equal to the first curvature.

* * * * *